United States Patent [19]

Hartranft et al.

[11] Patent Number: 4,605,980
[45] Date of Patent: Aug. 12, 1986

[54] INTEGRATED CIRCUIT HIGH VOLTAGE PROTECTION

[75] Inventors: Marc D. Hartranft, Scotts Valley; Keith A. Garrett, San Jose, both of Calif.

[73] Assignee: Zilog, Inc., Campbell, Calif.

[21] Appl. No.: 585,407

[22] Filed: Mar. 2, 1984

[51] Int. Cl.[4] .............................................. H02H 3/24
[52] U.S. Cl. ....................................... 361/56; 361/91; 357/23.13
[58] Field of Search ........................... 361/56, 91, 111; 357/23 GP, 23.13

[56] References Cited

U.S. PATENT DOCUMENTS

| | | | |
|---|---|---|---|
| 3,395,290 | 7/1968 | Farina et al. | |
| 3,403,270 | 9/1968 | Pace | 361/91 X |
| 3,673,427 | 6/1972 | McCoy et al. | 307/202 |
| 3,712,995 | 1/1973 | Steudel | 361/56 X |
| 4,061,928 | 12/1977 | Kessler | 361/56 X |
| 4,449,158 | 5/1984 | Taira | 357/23 GP X |
| 4,481,521 | 11/1984 | Okumura | 357/23 GP |

FOREIGN PATENT DOCUMENTS

| | | | |
|---|---|---|---|
| 55552 | 7/1982 | European Pat. Off. | 357/23 GP |
| 136278 | 10/1979 | Japan | 357/23 GP |
| 159188 | 12/1979 | Japan | 357/23 GP |
| 90555 | 7/1981 | Japan | 357/23 GP |

OTHER PUBLICATIONS

"Electrical Overstress/Electrostatic Discharge Symposium Proceedings", 1980, Reliability Analysis Center, pp. 73–80, EOS-2.
"Gate Protection of MIS Devices", Martin Lenzlinger, IEEE Transactions on Electron Device, vol. ED-18, No. 4, Apr. 1971.

Primary Examiner—A. D. Pellinen
Assistant Examiner—T. DeBoer
Attorney, Agent, or Firm—Majestic, Gallagher, Parsons & Siebert

[57] ABSTRACT

Protection of the thin gate oxide of MOS field effect transistors from irreversible puncture due to undesired high voltages and currents, generated by electrostatic discharge through handling or otherwise, is provided by a two stage circuit that operates to shunt thousands or tens of volts around the protected transistors. A first stage, employing a thick field effect transistor, protects against the very high voltage. A second stage, employing a thin field effect transistor, protects against lower but still excessive voltage. The protection circuit is formed as part of an integrated circuit chip by surrounding the lead bonding pad to which the protected transistors are connected.

3 Claims, 6 Drawing Figures

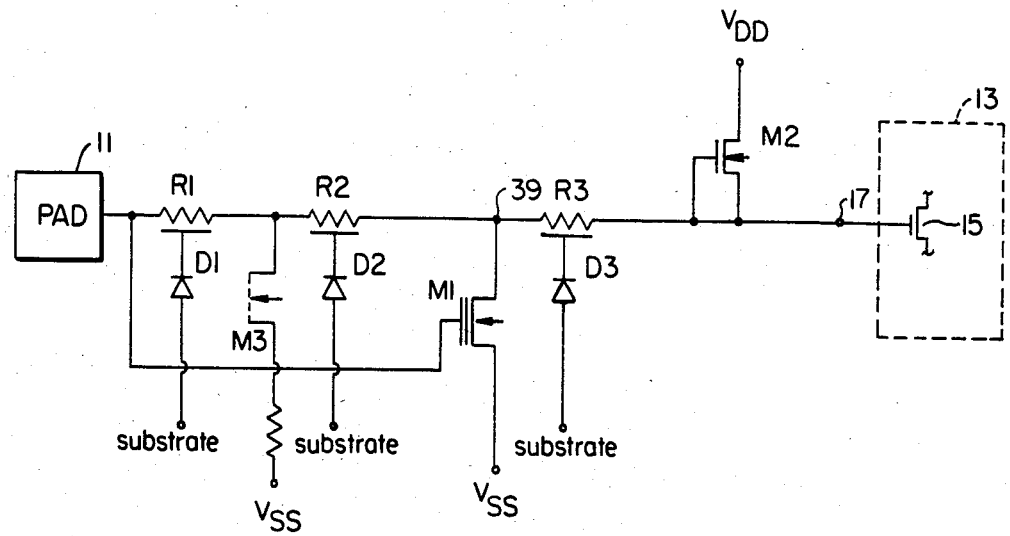
FIG._1.
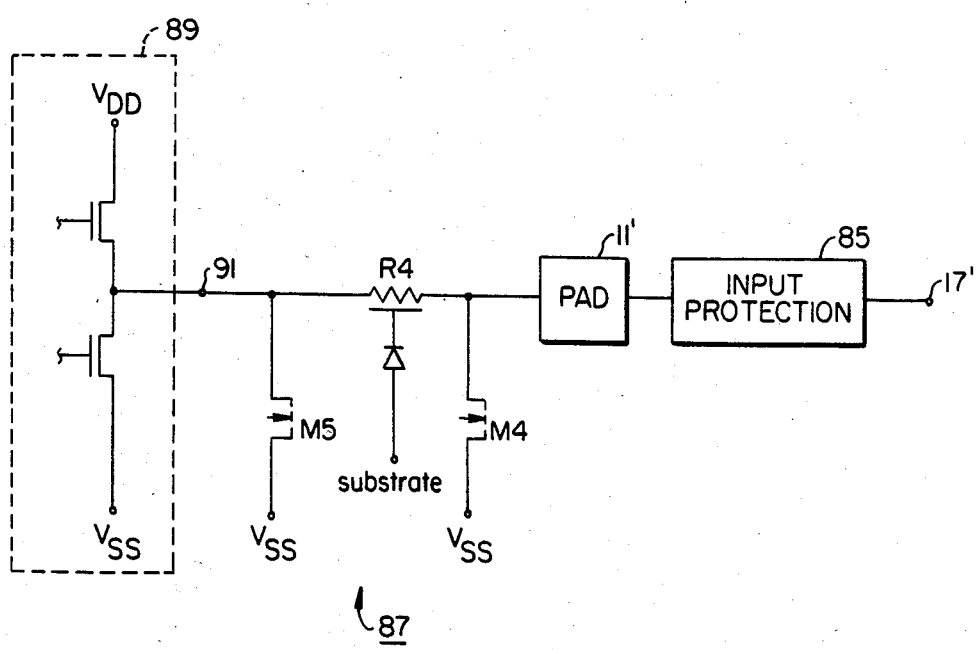
FIG._6.

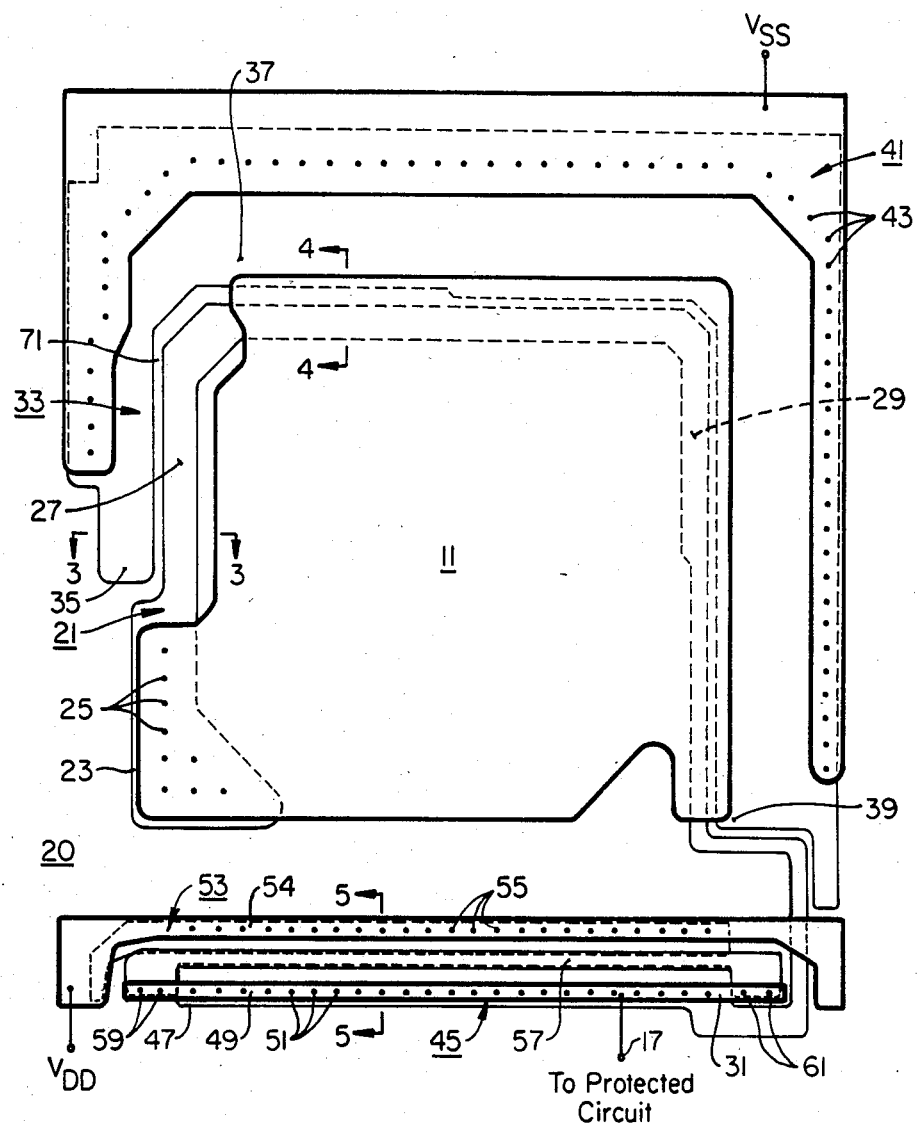
FIG._2.

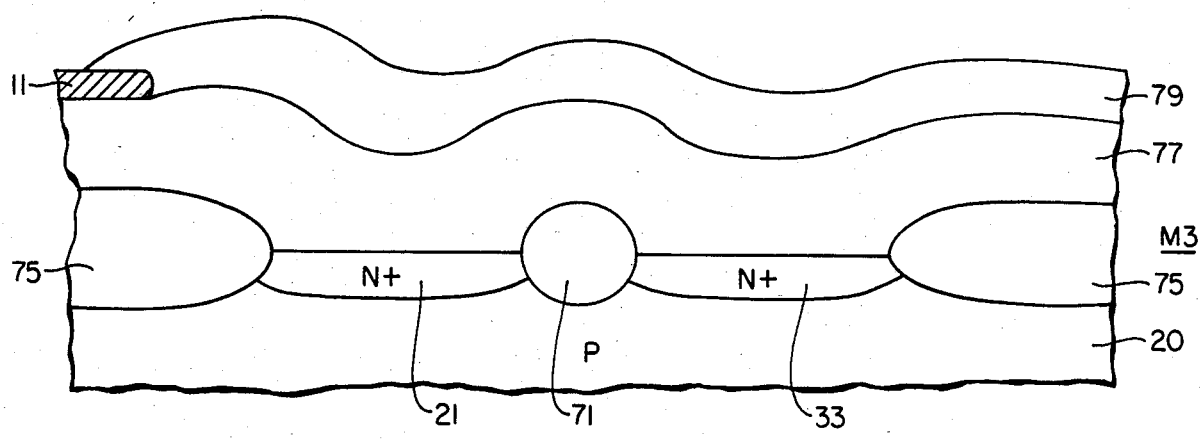
FIG._3.
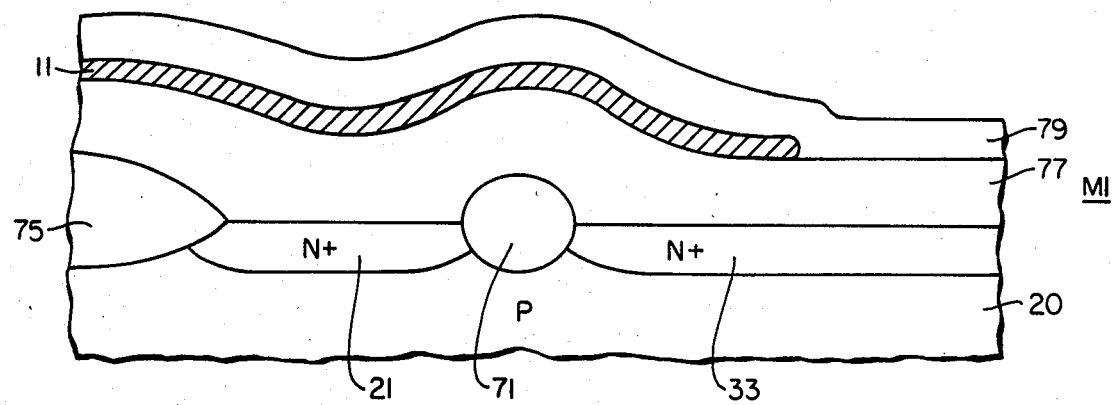
FIG._4.
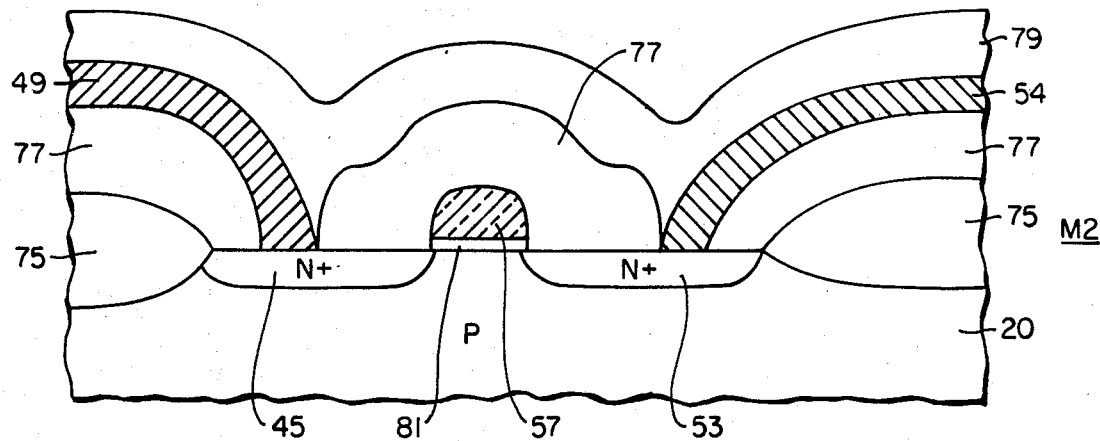
FIG._5.

INTEGRATED CIRCUIT HIGH VOLTAGE PROTECTION

BACKGROUND OF THE INVENTION

This invention relates generally to techniques and devices for protecting electronic circuits from undesired high voltage, particularly the protection of integrated circuit chips from high voltage spikes resulting from electrostatic discharges from handling of packaged circuits.

From the beginning of metal-oxide-silicon (MOS) integrated circuit semiconductor technology, it has been recognized that electrostatic discharges through the circuit that result from human handling of a finished chip product can permanently affect the operation of the circuit in undesirable ways. Principally, a thin oxide layer that isolates a gate electrode from the substrate of an MOS field effect transistor can be irreparably ruptured by a voltage spike being applied across it. In many cases, a gate electrode is connected in a signal path to a pin of a packaged integrated circuit, so the possibility of damage occurring in handling is very high, unless some protection circuitry is provided within the package.

The goal in providing such a protection circuit is to shunt the undesired voltage spikes around the sensitive field effect transistors without affecting the operation of the transistor and its signal paths to the integrated circuit package pins. An early technique was to provide a diode between a wire bonding connection pad and the integrated circuit substrate. As is well known, a wire is bonded between an integrated circuit package pin and a pad on the chip itself. It was found, however, that this did not provide adequate protection because the diode operated too slowly, resulting in the fragile gate oxide being ruptured before the diode operated to shunt the voltage spike around the transistor. The simple diode also has a breakdown voltage that is large compared to that of the thin oxide of the device to be protected. Another attempt involved the use of Zener diodes as shunting devices, but difficulties in reproduceability of Zener diodes in mass integrated circuit production caused that technique to be abandoned.

Other used diffused resistors in series connection between the pad and the transistor to be protected. A diffused resistor inherently forms a diode at its junction with the substrate, and further inherently possesses capacitance that, in combination with the resistance, provides a delay line. The delay of an undesired pulse in reaching the protected device provides more opportunity to shunt it around the transistor, but the diodes themselves do not do so adequately. Yet others have used thin and thick film field effect transistors as shunting devices, either alone or in combination with diffused resistors.

The result with current techniques is that existing integrated circuits are provided adequate protection against voltages above approximately 50 volts. The gate oxides presently utilized are in the 500-700 Angstrom range and can withstand the resulting 50 or so volts without damage. However, continuing development of integrated circuit technology is resulting in a new generation of MOS devices with thinner gate oxides. Currently proposed are 400 Angstrom thick gate oxide layers, with plans to go to a 250-300 Angstrom thickness and perhaps thinner (such as 200 Angstroms or even less) in a short period of time. A 300 Angstrom gate oxide can withstand only 30-35 volts across it without damage, and the thinner layers proportionately less. Therefore, existing circuits that provide protection of voltage spikes in excess of 50 volts are no longer adequate.

Accordingly, it is a primary object of the present invention to provide a circuit and technique for reducing any undesired voltage spikes to something less than 30-35 volts, and preferably to within approximately a 10-15 volt range and lower for the very thin gate oxides.

It is another object of the present invention to provide a circuit and technique giving protection against lower voltages that do not trigger the existing shunting circuits but yet which can damage such thin oxides.

It is a further object of the present invention to provide such protection without adversely affecting the operation of the circuit which is being protected, particularly to maintain reliability and speed of operation of the circuit.

SUMMARY OF THE INVENTION

These and additional objects are accomplished by the present invention wherein, briefly, according to one aspect thereof, a two stage series protection network is provided between the integrated circuit pad and the circuit to be protected. A first stage adjacent the pad is designed to shunt fast rise time, high voltage spikes. A second stage adjacent the circuit to be protected removes the lower voltages left unaffected by the first stage and not heretofore considered because existing gate oxides can withstand them. The technique and devices of the present invention are based upon the realization that the fast rise time, high voltage spike must be treated differently from the lower voltage pulse which is now becoming a problem because of the thinner gate oxides of the circuits to be protected. According to another aspect of the present invention, this is accomplished by employing a thick field effect transistor and a resistor-diode network as a first stage, and a thin gate field effect transistor as the second stage.

According to another aspect of the present invention, the protection circuit is arranged surrounding the pad on the semiconductor substrate such that the resistances and active devices are formed in little space but yet with a high degree of isolation. An elongated diffused resistor is provided between the pad and the circuit to be protected, this resistor surrounding over half of the perimeter of the wire bonding pad. The resistor is most conveniently formed by standard diffusion processes. A second diffused region is provided adjacent at least a portion of the length of the resistor but spaced a distance apart in order to form a thick oxide field effect device. The perimeter of the gate pad is extended over at least a portion of this field effect transistor to function as its gate.

Additional objects, advantages and features of the various aspects of the present invention become apparent from the following description of its preferred embodiments, which description should be taken in conjunction with the accompanying drawings.

BRIEF DESCRIPTION OF THE DRAWINGS

FIG. 1 is a schematic diagram of a protection circuit employing the present invention;

FIG. 2 is a plan view of an integrated circuit portion which shows a particular construction of the circuit of FIG. 1;

FIG. 3 is a cross-sectional view of the circuit layout of FIG. 2, taken at Section 3—3 thereof, showing the structure of a thick oxide punch through device of FIG. 1;

FIG. 4 is a sectional view of the circuit layout of FIG. 2, taken at Section 4—4 thereof, showing the structure of a thick oxide field effect transistor of FIG. 1;

FIG. 5 is a sectional view of the layout of FIG. 2 taken at Section 5—5 thereof, showing the structure of a thin oxide field effect transistor of FIG. 1; and FIG. 6 illustrates the use of the present invention in a circuit for protecting both input and output elements connected to a single pad.

DESCRIPTION OF THE PREFERRED EMBODIMENTS

Referring initially to FIG. 1, a schematic diagram of a circuit employing the present invention will be described. An integrated circuit pad 11 is provided, as is standard, for attaching a wire thereto. An integrated circuit has many such pads, all or a portion of which may desirably be provided with the protection of the present invention. A circuit 13 includes one or more MOS field effect transistors to be protected against excessive high voltage, one such transistor 15 being illustrated. The transistor 15 has its gate electrode connected to a terminal 17. The terminal 17 is at the end of a signal current path from the pad 11 that goes through the high voltage protection circuitry to be described.

Resistors R1, R2 and R3 are provided in series along the signal path. These resistances are preferably formed by diffusion into the substrate of the integrated circuit, in accordance with usual techniques. This inherently results in a junction between the diffused resistor and substrate that acts as a diode. Thus, diodes D1, D2 and D3 are shown in FIG. 1 associated with their respective resistances R1, R2 and R3. The diffused resistor also forms a capacitor with the substrate, not shown in FIG. 1, which introduces a delay in the signal's propagation from the pad to the active protected circuit 13 in the nature of a delay line.

A first MOS field effect transistor M1 has its source connected into the signal path between resistances R2 and R3, and its drain connected to a common circuit point, in this case the voltage supply terminal $V_{SS}$ which is most often connected to a ground potential bus of the circuit, for an n-channel device. The transistor M1, in the specific circuit configuration of FIG. 1, provides a controllable shunting path of undesired high voltage spikes from the signal path to the circuit's ground bus, thus avoiding that potential being placed upon the gate of the protected device 15.

The high voltage is so shunted to ground through the transistor M1 when the voltage on its gate, which is connected to the signal path at the pad 11, reaches the threshold value of the transistor M1. That threshold value is necessarily high because the gate oxide must be thick enough to avoid its destruction by the high voltage spikes against which it is to protect subsequent devices. Because of the thick gate oxide, a gate voltage in the neighborhood of 50-100 volts is required, as an example, depending upon the exact transistor characteristics, to cause transistor M1 to be switched on and to become relatively highly conductive. Once completely turned on, the transistor M1 has an impedance that depends primarily upon the geometry of its source and drain, and the spacing between them, as is well known.

The maximum voltage in the signal path at a circuit node 39 between resistances R2 and R3 is limited by the impedance of the transistor M1. In this case, a voltage divider is formed by the series impedances R1, R2 and M1, across which the high voltage spike on the pad 11 is impressed. This reduced voltage drop across M1 may be, for example, much less than 50 volts. Depending upon the nature of the input voltage spike, the voltage at node 39 can further be limited by the second stage described below.

Because the resistances R1 and R2 are placed in series in the signal path between the gate connection of the transistor M1 and its source connection, the transistor M1 is more likely to be turned on hard before a fast rising pulse reaches its source than would be the case if its gate was connected to the node 39. This is because of the delay line characteristic of the diffused resistors R1 and R2.

As a further optional element in the first stage of the protection circuit, a punch through device M3 is connected between the signal path at a junction between the resistances R1 and R2, and the common circuit point $V_{SS}$. An advantage of the device M3 is to provide a second path for shunting undesired high voltage pulses to the common circuit point that is in parallel with the transistor M1, in case the transistor M1 cannot handle it. This is particularly advantageous for high energy pulses.

The voltages at the pad 11 which are less than the threshold voltage of the transistor M1 will not be limited by that transistor, since it will not be turned on by voltages less than its threshold, but yet can still be higher than the 10-15 volts maximum that is desired. Therefore, in order to shunt such a lower voltage that may appear on the pad 11 away from the protected device 15, a second transistor M2 is connected to the signal path on an opposite side of another series resistance R3. The transistor M2 can now have a thin oxide since the protection afforded by the first transistor M1 assures that a voltage at the output terminal 17 will remain below approximately 50 volts, as an example, or other voltage range resulting from a particular geometry of M1. The gate oxide of the transistor M2 is made to have a thickness substantially the same as that of the protected device 15. This can be in the order of 200-400 Angstroms. The voltage at the node 39 can still be in the neighborhood of 50 volts and not cause the gate oxide of M2 to rupture because its gate is electrically connected to its channel. The thinner gate oxide means that the transistor M2 can be made with a low threshold voltage, below the desired 10-15 volts, even as low as typically 0.5-1.0 volts. Once the voltage in the signal path at the terminal 17 exceeds the threshold of M2, it turns on and the voltage at that terminal is then limited to a value above $V_{DD}$ that depends upon its impedance as controlled by the geometry of the device.

It will be noted that the thin film transistor M2 is connected between the signal path and the supply bus for the voltage $V_{DD}$ rather than the substrate or the voltage bus for $V_{SS}$. This is because the latter are likely to be elevated in voltage in response to a high voltage spike being applied to the pad 11. A further limitation of the voltage rise is thus desired to be made to a different common point of the circuit.

The second stage, namely transistor M2, of the voltage protection circuit thus protects the device 15 from voltages applied to the pad 11 which are not high enough to effectively turn on the transistor M1. Further, because of the second stage existing, the transistor M1 need not reduce the voltage all of the way. For example, if the transistor M1 reduces high voltage spikes at the node 39 to less than the 50 volt range, as used in this example, the transistor M2 is turned on. Whether turned on by that mechanism or by a lower voltage that is ignored by the transistor M1, the transistor M2 forms a voltage divider in series with the resistances R1, R2 and R3. The voltage drop across M2 of this series circuit thus becomes the voltage at the output terminal 17.

The discussion so far has described the mechanism of the circuit in protecting against positive high voltage pulses or spikes. The circuit works to protect against negative spikes, as well. Each of the transistors M1 and M2 has an equivalent NPN bipolar transistor which provides a high negative pulse current handling capability.

A preferred layout of the circuit of FIG. 1 on a silicon integrated circuit chip is illustrated in FIGS. 2-5. A large number of layouts for implementing the circuit of FIG. 1 are possible, but that shown in FIGS. 2-5 provides a functional circuit in very little space and with few additional structural components. This and the other circuits in this application provide for a p-type silicon substrate with n-type diffused regions, an n-channel device. Of course, a p-channel structure could alternatively be utilized, wherein the polarities of the components illustrated would be reversed. Additionally, the circuit can advantageously be implemented in CMOS, latch-up susceptability being dramatically improved.

Referring to the plan view of the preferred circuit layout of FIG. 2, a substrate 20 has an elongated diffusion 21 which forms the series resistors R1, R2 and R3 of FIG. 1. An end 23 of the diffused region 21 is electrically connected to a corner of the lead bonding pad 11, which is itself electrically conducting, by a plurality of contacts 25. The resistance R1 is formed generally between the end 23 of the diffusion and an intermediate point 27. The resistance R2 is formed between about the point 27 and another intermediate point 29. The resistance R3 can similarly be viewed as that part of the diffusion 21 extending from about the point 29 to about the point 31. The arrangement of the diffusion 21 is functionally and space efficient in being laid out around three sides of the perimeter of the rectangularly shaped pad 11. This layout provides good isolation, yet uses very little space.

The diffusion 21 is not only used to form the three signal path resistances, but portions of its length are also utilized as source diffusions for the punch through device M3 and the transistor M1. A drain diffusion for these devices is provided by the diffusion 33 which extends along the line of most of the diffusion 21 but is separated therefrom by a gap in which a field oxide layer 71 is deposited. The punch through device M3 is formed between about location 35, which is one end of the diffusion 33, and an intermediate location 37. The structure of the device M3 is shown in more detail in the cross-sectional view of FIG. 3. The transistor M1 is formed in a region extending approximately between the location 37 and the location 39 of FIG. 2. The structure of the transistor M1 is shown in more detail in the cross-sectional view of FIG. 4. A metal layer 41 overlays a portion of the diffusion 33 and is electrically connected thereto along substantially all of its length by a large number of contacts 43. The metal 41, and thus the diffusion 33, is connected to the circuit common point $V_{SS}$.

In order to further simplify the circuitry, an edge of the conductive pad 11 extending between the locations 37 and 39 serves as the gate electrode for the thick film transistor M1. As noted in the schematic diagram of FIG. 1, the gate of the transistor M1 is electrically connected directly to the pad 11. But since the punch through device M3 has no gate, the pad 11 is cut away so as not to extend over the diffusions 21 or 33 in a region between locations 35 and 37.

The thin film transistor M2 is separately formed by a structure shown at the bottom of the plan view of FIG. 2, a cross-section of which is given in FIG. 5. An elongated drain diffusion 45 is connected at one end to the diffusion 21 at its location 31. In fact, the diffusions 21 and 45 are formed as a single structure. The drain diffusion 45 extends between the locations 31 and 47. A metal conductive layer 49 extends along the length of the diffusion and a short distance beyond, this metal layer becoming the output terminal 17 of the protection circuit. The metal 49 is electrically connected to the diffusion 45 by a plurality of contacts 51 along its length.

A separate source diffusion 53 is positioned adjacent the drain diffusion 45. A metal layer 54 overlays the diffusion 53 and is electrically connected therewith by a plurality of contacts 55 along their lengths. The metal layer 54 is then the common point $V_{DD}$ for the circuit.

A polysilicon gate 57 overlays a thin field oxide layer 81 in the space between the drain and source diffusion 45 and 53. This conductive gate 57 is attached at one end by contacts 59 to the metal layer 49 and, similarly, at its other end by contacts 61 to the same metal layer 49. This then forms the transistor M2 shown schematically in FIG. 1.

Additional conventional oxide and protective layers, not shown in FIG. 2, are also utilized. These are shown in the cross-sectional views of FIGS. 3-5. They include a field oxide layer 75, an overlaying field oxide layer 77, and a topside protective oxide layer 79. It will be noted from FIG. 4 that the thickness of the field oxide 77 will determine, in large part, the threshold voltage characteristics of the device M1.

What has been described with respect to FIGS. 1-5 is a particular example of an input protection circuit that utilizes the various aspects of the present invention. Protection of a similar nature is also desired to protect output circuits that are connected to an integrated circuit pad. With reference to FIG. 6, a pad 11' is shown to be connected to both input circuits, through input protection 85, and to output circuits 89 through output protection 87. Although output circuits are not as sensitive to the high voltage spikes that are generated by electrostatic discharge from handling or otherwise, they are still sensitive to some degree and protection of them at a point 91 in the output signal path is usually desired. The input protection 85 functions to bleed voltage of the pad 11'. A resistor R4 is used to limit the rise time of the voltage at node 91. Punch through devices M4 and M5 provide further protection against high voltage spikes.

If only an output circuit is connected to a pad, the circuit of FIG. 6 is still used, except that the input protection 85 includes only those components of the FIG. 1 protection circuit between the pad and the node 39. The elements R3 and M2 are omitted.

Although the various aspects of the present invention have been described in their preferred embodiments, it will be understood that the invention is entitled to protection within the full scope of the appended claims.

It is claimed:

1. As part of an integrated circuit chip formed on a semiconductor substrate, having a wire connection pad and an active circuit to be protected from high voltage spikes introduced through said pad, a protection circuit located on said chip and disposed in an electrical current path therebetween, comprising:

a first effect transistor having a gate connected to said current path, and source and drain connections disposed between said current path and a first common point of the active circuit, said gate separated by an insulative layer a distance from said substrate such that the gate insulation remains effective during said high voltage spikes, whereby the existance of a high voltage spike causes the first transistor to turn on with a low impedance path between said current path and said first common point and thus limit the voltage in said current path, a first resistance provided in said current path between said pad and said first field effect transistor, said gate of said first transistor being connected on the pad side of said first resistance, a punch through semiconductor device connected between said current path intermediate of said first resistance and said first common point, thereby to provide a second low impedance path between said current path and said first common point for high voltage spikes, and a second field effect transistor having a gate connected to said current path at an intermediate location between the first transistor and the active circuit, and source and drain connections disposed between said current path at said intermediate location and a second common point of the active circuit, said gate being separated by an insulative layer a distance from said substrate such that the gate insulation would irreversibly break down during said high voltage spikes but is protected therefrom by said first field effect transistor.

2. The protection circuit according to claim 1 wherein said first resistor is provided as at least part of a single elongated resistor structure that is diffused into said substrate in a path around at least a portion of a perimeter of said pad, said diffused resistor also serving in different segments thereof as the source or drain of each of said first transistor and said punch through device.

3. The protection circuit according to claim 2 wherein the gate of said first field effect transistor comprises a portion of said pad perimeter.

* * * * *

UNITED STATES PATENT AND TRADEMARK OFFICE
CERTIFICATE OF CORRECTION

PATENT NO. : 4,605,980

DATED : Aug. 12, 1986

INVENTOR(S) : Hartranft, et al.

It is certified that error appears in the above-identified patent and that said Letters Patent is hereby corrected as shown below:

Col. 7, line 12: insert --field-- between "first" and "effect".

Signed and Sealed this

Twenty-eighth Day of October, 1986

[SEAL]

Attest:

DONALD J. QUIGG

Attesting Officer     Commissioner of Patents and Trademarks